(12) United States Patent
Kordunsky

(10) Patent No.: US 12,293,861 B2
(45) Date of Patent: May 6, 2025

(54) MAGNETIC FIELD SUPPRESSION SYSTEM

(71) Applicant: Technical Manufacturing Corporation, Peabody, MA (US)

(72) Inventor: Igor Kordunsky, Quincy, MA (US)

(73) Assignee: Technical Manufacturing Corporation, Peabody, MA (US)

( * ) Notice: Subject to any disclaimer, the term of this patent is extended or adjusted under 35 U.S.C. 154(b) by 610 days.

(21) Appl. No.: 17/601,656

(22) PCT Filed: Apr. 7, 2020

(86) PCT No.: PCT/US2020/026987
§ 371 (c)(1),
(2) Date: Oct. 5, 2021

(87) PCT Pub. No.: WO2020/210183
PCT Pub. Date: Oct. 15, 2020

(65) Prior Publication Data
US 2022/0181062 A1 Jun. 9, 2022

Related U.S. Application Data

(60) Provisional application No. 62/830,806, filed on Apr. 8, 2019.

(51) Int. Cl.
*H01F 13/00* (2006.01)
*H01F 7/20* (2006.01)

(52) U.S. Cl.
CPC .............. *H01F 13/006* (2013.01); *H01F 7/20* (2013.01)

(58) Field of Classification Search
CPC . H01F 7/20; H01F 7/064; H01F 7/202; H01F 7/0278; H01F 7/204; H01F 38/14;
(Continued)

(56) References Cited

U.S. PATENT DOCUMENTS 5,660,255 A  8/1997 Schubert et al.
5,823,307 A  10/1998 Schubert et al.
(Continued)

FOREIGN PATENT DOCUMENTS

JP  H07322277 A  12/1995
JP  2003015315 A  1/2003
(Continued)

OTHER PUBLICATIONS

International Search Report and Written Opinion mailed Jul. 24, 2020 in International application no. PCT/US2020/026987 15 pages.
(Continued)

*Primary Examiner* — Bryan R Perez
(74) *Attorney, Agent, or Firm* — Smith Baluch LLP

(57) ABSTRACT

Apparatus and methods to reduce unwanted magnetic fields and unwanted motion in precision instruments are described. A coil assembly that is used to generate an opposing magnetic field can include a first coil configured to generate a static magnetic field and a second coil configured to generate a time-varying magnetic field. The first and second coils can be in close proximity and sized to suppress magnetic fields over a large localized region. The first coil can be connected to a choke to increase its impedance seen by the second coil.

28 Claims, 5 Drawing Sheets

(58) Field of Classification Search
CPC ........ H01F 38/00; H01F 41/10; H01F 41/041;
H01F 41/303; H01F 41/14; H01F 41/18;
H01F 27/24; H01F 27/28; H01F 27/027;
H01F 27/36; H01F 27/363
See application file for complete search history.

(56) References Cited

U.S. PATENT DOCUMENTS

| | | | |
|---|---|---|---|
| 7,726,452 | B2 | 6/2010 | Kraner |
| 8,899,393 | B2 | 12/2014 | Kraner et al. |
| 9,353,824 | B2 | 5/2016 | Kraner et al. |
| 2010/0033186 | A1* | 2/2010 | Overweg ............ A61B 5/0035 |
| | | | 324/318 |
| 2018/0033575 | A1* | 2/2018 | Zacherl ............... H01H 50/021 |
| 2020/0182952 | A1* | 6/2020 | Hong .................. A61B 5/0515 |

FOREIGN PATENT DOCUMENTS

| | | |
|---|---|---|
| WO | 2018198222 A1 | 11/2018 |
| WO | 2019035882 A1 | 2/2019 |
| WO | 2020210183 A1 | 10/2020 |

OTHER PUBLICATIONS

Parry "Helmholtz coils and coil design." Developments in Solid Earth Geophysics. vol. 3. Elsevier, 2013. 551-567.

* cited by examiner

MAGNETIC FIELD SUPPRESSION SYSTEM

CROSS-REFERENCE TO RELATED APPLICATIONS

This application is a U.S. national stage filing under 35 U.S.C. 371 of PCT/US2020/026987, filed Apr. 7, 2020, and entitled "MAGNETIC FIELD SUPPRESSION SYSTEM," which claims the priority benefit, under 35 U.S.C. 119 (e), of U.S. Application No. 62/830,806, filed on Apr. 8, 2019 and entitled "MAGNETIC FIELD SUPPRESSION SYSTEM," each of which is incorporated herein by reference in its entirety.

BACKGROUND

Technical Field

The technology relates to apparatus and methods for suppressing magnetic fields in a localized region, such as in the vicinity of precision instruments that may be sensitive to external magnetic fields.

Discussion of the Related Art

Precision instruments that are used in various areas of technology (e.g., integrated circuit fabrication, metrology, sample inspection, various areas of microscopy, precision medical instruments, etc.) benefit from isolation of ambient sources of noise that can couple unwanted motion (e.g., vibrations, impulses, etc.) and unwanted magnetic fields into a precision instrument. One approach to vibration isolation is to mount an instrument on a platform that has passive motion dampers (e.g., an air-suspension and/or spring-suspension system with motion-damping components such as passive dampers with viscous fluid or material). In some cases, a precision instrument may need vibration isolation from external sources to levels where passive motion dampers do not provide adequate isolation. To achieve such performance, an active vibration-isolation system may be employed between a precision instrument and a base which supports the instrument. For example, an active feedback system may be used to drive actuators to oppose externally-induced motion of the precision instrument. One approach to suppressing magnetic fields is to locate magnetic coils in the vicinity of a precision instrument and to generate a magnetic field that is approximately equal and opposite to an unwanted magnetic field that is incident on the instrument. The generated magnetic field may substantially cancel and redistribute the incident magnetic field, so that the total magnetic field in the vicinity of the instrument is significantly reduced.

SUMMARY

Apparatus and methods for suppressing magnetic fields in a localized region are described. Both static and time-varying magnetic fields can be significantly attenuated by at least a factor of 7 (in amplitude) over a range of frequencies from DC to 300 Hz for large localized regions. According to some embodiments, separate DC and AC coils contained in compact coil assemblies are used to cancel unwanted magnetic fields. A DC coil in a coil assembly can be used to cancel an unwanted static component of magnetic field, such as the Earth's magnetic field, in a localized region. An AC coil in a coil assembly can be used to cancel an unwanted time-varying component of magnetic field in the localized region. Unwanted time-varying magnetic field may be generated, in some cases, by equipment external to the localized region.

Some embodiments relate to a magnetic field suppression system comprising a first coil assembly having a first winding configured to generate a static magnetic field along a first direction through a center of the first coil assembly, and a second winding configured to generate a time-varying magnetic field along the same direction.

Some embodiments relate to a magnetic field suppression system comprising a first coil assembly arranged to create a magnetic field in a first direction, a second coil assembly arranged to create a magnetic field in a second direction that is essentially orthogonal to the first direction, and a third coil assembly arranged to create a magnetic field in a third direction that is essentially orthogonal to the first direction and the second direction, wherein each of the first coil assembly, second coil assembly, and third coil assembly includes a first winding configured to generate a static magnetic field and a second winding configured to generate a time-varying magnetic field.

Some embodiments relate to a method of suppressing magnetic field in a localized region, the method comprising acts of: applying DC current to a first winding of a coil assembly to generate a first magnetic field that reduces a first static component of a magnetic field present in the localized region; and applying a time-varying current to a second winding of the coil assembly to generate a second magnetic field that reduces a first time-varying component of the magnetic field present in the localized region, wherein the first DC winding is located within 8 cm of the second AC winding.

The foregoing summary is provided by way of illustration and is not intended to be limiting. The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. The drawings are not intended to limit the scope of the present teachings in any way.

Aspects, embodiments, and features of the present teachings can be more fully understood from the following description in conjunction with the accompanying drawings.

DETAILED DESCRIPTION

The scientific research communities and the microfabrication, medical, nanotechnology, optics, and semiconductor industries continue to develop challenging demands for noise-free environments for precision instruments used in research, medical, and commercial manufacturing settings. Sources of noise can include energy sources that cause unwanted vibrations in a precision instrument and magnetic and electromagnetic fields that cause unwanted magnetic fields in a precision instrument. Vibration isolation typically requires suppression of dynamic forces (typically from external sources) that would otherwise act upon and perturb a precision instrument and impair its performance. To obtain proper operation and improved performance of some precision instruments, it may be necessary to suppress unwanted motion of an instrument to the sub-micron or even sub-100-nm level.

Further, some instruments that are sensitive to magnetic fields may require apparatus that can suppress ambient magnetic fields. Such instruments include, but are not limited to, electron microscopes and electron-beam patterning tools. In some cases, such precision instruments may require vibration isolation to the sub-micron or even sub-100-nm level and suppression of ambient magnetic fields by at least a factor of 5 in amplitude over a range of frequencies and over large areas. The inventor has recognized and appreciated that effective suppression of unwanted static (DC) and time-varying (AC) magnetic fields over large areas can be achieved by using separate DC and AC coils in a coil assembly, as described in further detail below, rather than using a single winding in a coil assembly.

Figure 1:
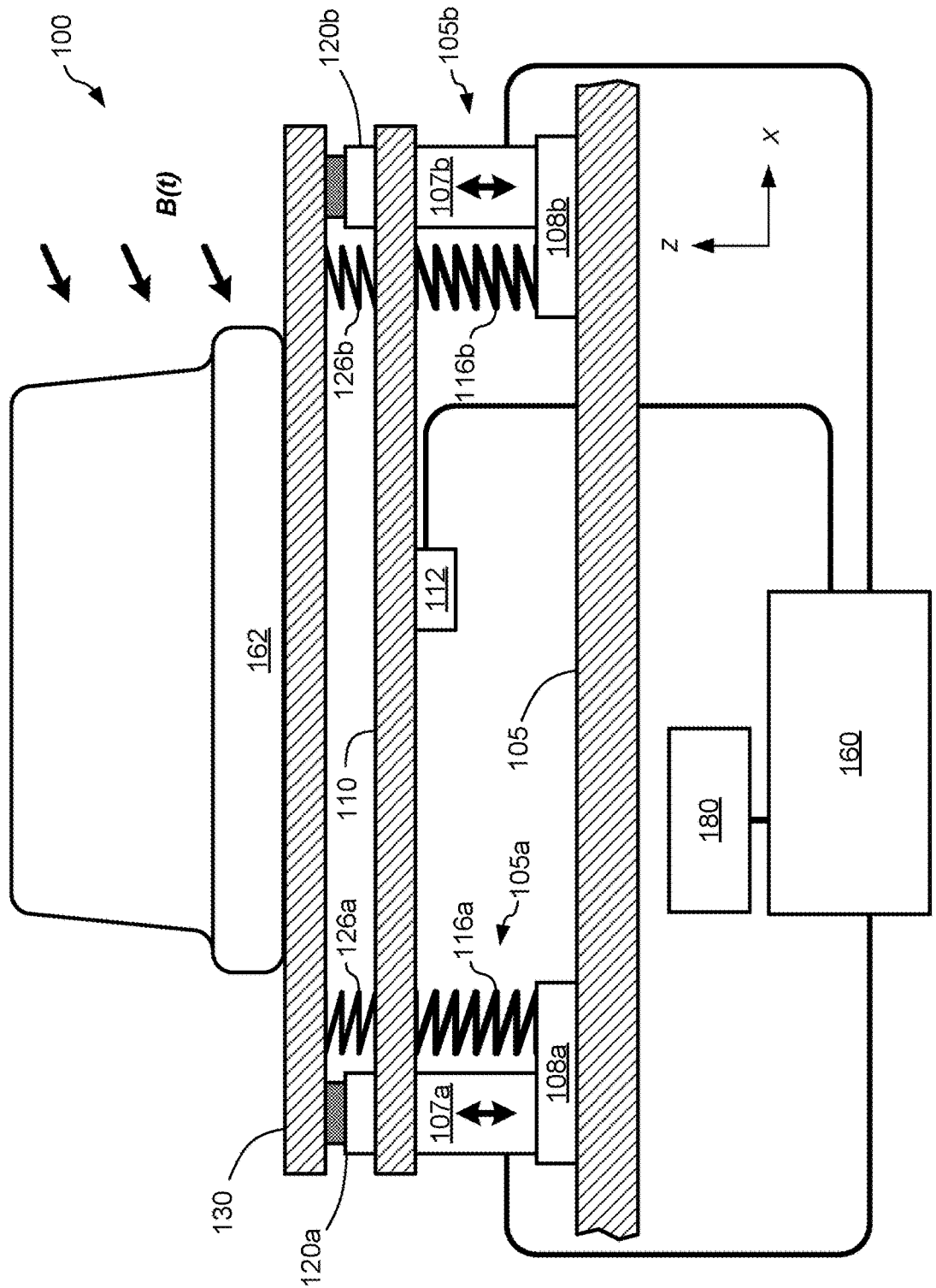
FIG. 1 depicts an instrument on a vibration isolation platform that may be subject to a magnetic field, according to some embodiments.

One example of a vibration isolation system 100 is illustrated in FIG. 1. The system 100 may support a payload 162 (such as a precision instrument) that may be subjected to an unwanted magnetic field B(t). The illustration is a simplified diagram of an active vibration-isolation system 100 that employs a feedback loop to suppress unwanted motion of the payload 162, according to some embodiments. Although only one example of a vibration-isolation system is illustrated and described in detail, other types of vibration-isolation systems can be used in combination with a magnetic field suppression system. Other types of vibration-isolation systems include, but are not limited to, an active vibration-isolation system that employs feedback and feedforward control as described in International application No. PCT/US2018/000146, titled "Precision Vibration-Isolation System with Floor Feedforward Assistance" and filed on Aug. 15, 2018, which is incorporated herein by reference. Other types of vibration-isolation systems include, but are not limited to, active vibration-isolation systems in which one or more actuators used to suppress unwanted motion of the payload carry a majority of weight of the payload, such as the vibration-isolation system described in U.S. Pat. No. 5,823,307, titled "Stiff Actuator Active Vibration Isolation System" and filed on May 2, 1997, which is incorporated herein by reference. Other types of vibration-isolation systems also include passive vibration-isolation systems mentioned above.

In some embodiments and referring again to FIG. 1, an active vibration-isolation system 100 can comprise an intermediate mass 110 that is supported above a base 105 by plural isolation assemblies 105a, 105b. One or more motion sensors 112 can be mounted on the intermediate mass to sense motion of the intermediate mass in one or more directions (e.g., in the z direction for the embodiment depicted in FIG. 1, though x and y directions may be sensed with additional sensors in other embodiments). In some cases, a single multi-axis sensor (e.g., a multi-axis geophone or accelerometer) can sense motion of the intermediated mass in two or more directions. Output from the motion sensor(s) can be provided to control circuit 160 that processes the signal(s) and provides drive signals to actuators 107a, 107b in the isolation assemblies 105a, 105b to oppose and reduce sensed motion. The actuators 107a, 107b can be arranged to drive the intermediate mass 110 relative to the base 105. Such feedback control operates to reduce unwanted motion of the intermediate mass 110. An active vibration-isolation system 100 can further include support structure (e.g., payload support 130) with passive vibration isolation (e.g., dampers 120a, 120b, and springs 126a, 126b) located above the intermediate mass that supports a payload 162. In some cases, the payload 162 can be a precision instrument, examples of which are given above.

Although only two isolation assemblies 105a, 105b are shown in the drawing of FIG. 1, an active vibration-isolation system 100 can include three or more isolation assemblies arranged between an intermediate mass 110 and the base 105. In some embodiments, there can be isolation assemblies configured to provide vibration isolation in multiple directions (e.g., in the x and/or y directions and arranged between the intermediate mass 110 and side walls or posts extending up from the base 105), and not only the z direction as depicted in FIG. 1.

In some cases, the isolation assemblies can be configured to provide isolation against perturbations that would otherwise affect pitch, roll, and/or yaw of the intermediate mass 110. For example, two or three motion sensors places at different locations on the intermediate mass 110 can detect pitch, roll, and/or yaw of the intermediate mass 110 and produce feedback signals that can be processed by the control circuit 160 to drive actuators to cancel the detected pitch, roll, and/or yaw. As just an example of roll, a first sensor near a first isolation assembly 105a may detect a different z motion of the intermediate mass 110 than is detected by a second sensor near a second isolation assembly 105b. In response to the differences in detected z motion (indicating roll of the intermediate mass 110), the control circuit can drive a first actuator 107a differently than a second actuator 107b to cancel the roll.

In some embodiments, isolation assemblies can include offload springs and actuators. For example, a first isolation assembly 105a can comprise an offload spring 116a and actuator 107a. In some implementations, the offload springs 116a, 116b can have a greater stiffness than the actuators 107a, 107b, such that the offload springs carry most or all of the weight of the payload 162, intermediate mass 110, and supporting structure above the intermediate mass 110. In some cases, the offload springs 116a, 116b can be variable-rate springs to accommodate a range of payload weights and exhibit a stiffness greater than the actuators. Examples of systems in which the offload springs have greater stiffness than the actuators are described in U.S. Pat. Nos. 8,899,393 and 9,353,824 which are incorporated herein by reference in their entirety. In such implementations, the actuator can comprise a soft actuator such as a voice coil driver.

In some embodiments, the offload springs 116a, 116b may not be present or can have a stiffness less than the actuators 107a, 107b, such that the actuators carry most or all of the weight of the payload 162, intermediate mass 110, and supporting structure above the intermediate mass 110. Examples of systems in which the offload springs have less stiffness than the actuators are described in U.S. Pat. No. 5,660,255 which is incorporated herein by reference in its entirety. In such implementations, the actuator can comprise a stiff actuator such as a piezoelectric actuator.

The intermediate mass 110 can be formed from any suitable material, such as aluminum, stainless steel, or a combination thereof, though other materials can be used in some embodiments. Although FIG. 1 shows one intermediate mass 110 that spans plural isolation assemblies 105a, 105b, in some cases each isolation assembly can have its own intermediate mass which is not connected to the intermediate mass of all other isolation assemblies. In such cases, one or more motion sensors 112 can be mounted on each isolation assembly's intermediate mass to sense motion in one or more directions. Each isolation assembly can support separated regions of a payload 162. In some cases, each isolation assembly can be controlled by a same feedback loop for a given direction, such that the isolation assemblies operate in parallel from a common actuator drive signal. In some cases, each isolation assembly can be controlled by different feedback loops for a given direction, such that the isolation assemblies operate in parallel from different actuator drive signals. When each isolation assembly is controlled by a different feedback loop and the isolation assemblies are separated, cancellation of pitch, roll, and/or yaw can occur automatically and need not be separately sensed and accounted for.

The base 105 can comprise any suitable material, such as aluminum, stainless steel, or a combination thereof, though other materials can be used. In some implementations, the base 105 can comprise a floor, table or other structure located at a facility, and may not be included as part of a manufactured vibration-isolation system 100. In such implementations, an isolation assembly 105a can be provided as a separately packaged assembly that is configured to mount between the payload 162 and base 105.

According to some implementations, level adjusters 108a, 108b can be included with an isolation assembly to adjust the levelness of the intermediate mass 110 and/or the payload 162. A level adjuster 108a, for example, can comprise a threaded drive assembly that is coupled to an actuator 107a and can be rotated (manually and/or automatically) to adjust a height of an actuator 107a, 107b above a base 105. In some cases, a level adjuster can further adjust the height of an offload spring 116a above the base 105.

According to some embodiments, a motion sensor 112 can comprise an accelerometer or geophone, for example, and can output at least one signal representative of motion in one direction (e.g., the z direction) to control circuit 160. Other types of motion sensors (e.g., strain-gauge sensors, microelectromechanical sensors, gyrometers, optical interferometric sensors, etc.) can also be used, and the invention is not limited to only accelerometers and geophones. In multi-axis vibration-isolation systems, one or more motion sensors 112 can output motion signals representative of motion in two or more directions (for example, any combination of x, y, z, pitch, roll, and yaw). Control circuit 160 can be configured to process signals from the motion sensor(s) 112 and output drive signals to the actuators 107a, 107b that drive the intermediate mass 110 in a manner to oppose motion sensed by the motion sensor. Some examples of feedback control that may be included in control circuit 160 are described in connection with FIGS. 1, 2, 4, 18, 19, and 22 in U.S. Pat. No. 5,823,307 and in connection with FIG. 4 in U.S. Pat. No. 7,726,452, both of which are incorporated herein by reference. The control circuit 160 can include passive, active, analog, and/or digital circuit components, and can include processing electronics (e.g., logic components, a microcontroller, a microprocessor, a field-programmable gate array, an application-specific integrated circuit, a digital signal processor, or some combination thereof) adapted to perform feedback cancellation of unwanted motion as described herein and in the sections of the aforementioned U.S. patents.

A user interface 180 can be in communication with the control circuit 160, according to some embodiments, and can be configured to receive user input and indicate a stability of operation of the vibration-isolation system 100. A user interface can comprise a touch screen, a touch panel, a graphical user interface, mechanical knobs, buttons, toggles, or switches, indicator lights, an imaging display, or some combination thereof. In some implementations, a user interface 180 comprises a personal computer or smartphone that communicates with control circuit through a wireless or wired communication link. A custom software application can be executing on the personal computer or smartphone that allows communication with and reconfiguration of software elements executing on processing electronics of control circuit 160. According to some embodiments, a payload support 130 can be supported over the intermediate mass 110 by additional support springs 126a, 126b. Also, dampers 120a, 120b can be added between the payload support 130 and the intermediate mass 110 to dampen motion of the payload support. In some embodiments, there can be three or more sets of support springs 126a, 126b and dampers 120a, 120b. In some cases, level adjusters 108a, 108b can be included between the payload support 130 and the intermediate mass 110 for levelling the payload support 130 and/or payload 162. In some implementations, the payload 162 can be mounted directly on a single payload support 130 that spans plural support springs 126a, 126b and dampers 120a, 120b as shown. In other implementations, the payload support 130 may not span plural support springs and dampers. Instead, separate payload support plates can be located at each support spring and damper and support a portion of the payload 162. In some cases, the support springs 126a, 126b and dampers 120a, 120b can connect directly to separated locations on the payload 162 and a payload support or payload support plates may not be used.

Figure 2A:
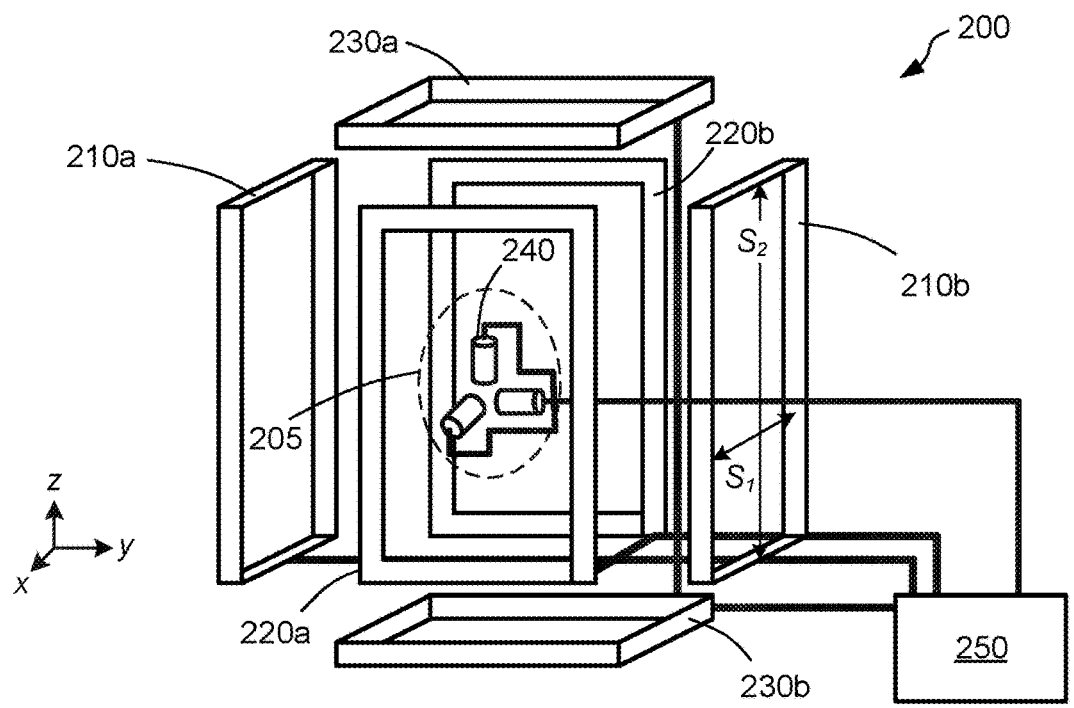
FIG. 2A depicts apparatus that may be used to suppress magnetic fields in a localized region, according to some embodiments.
Figure 2B:
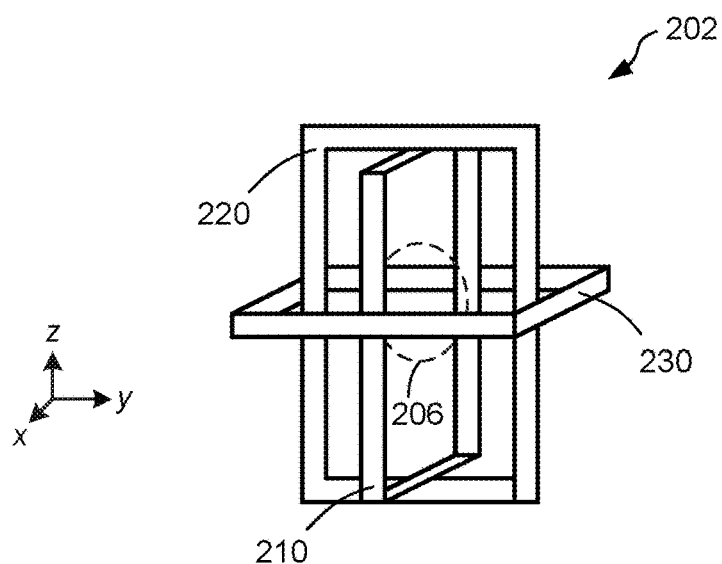
FIG. 2B depicts apparatus that may be used to suppress magnetic fields in a localized region, according to some embodiments.
Figure 2C:
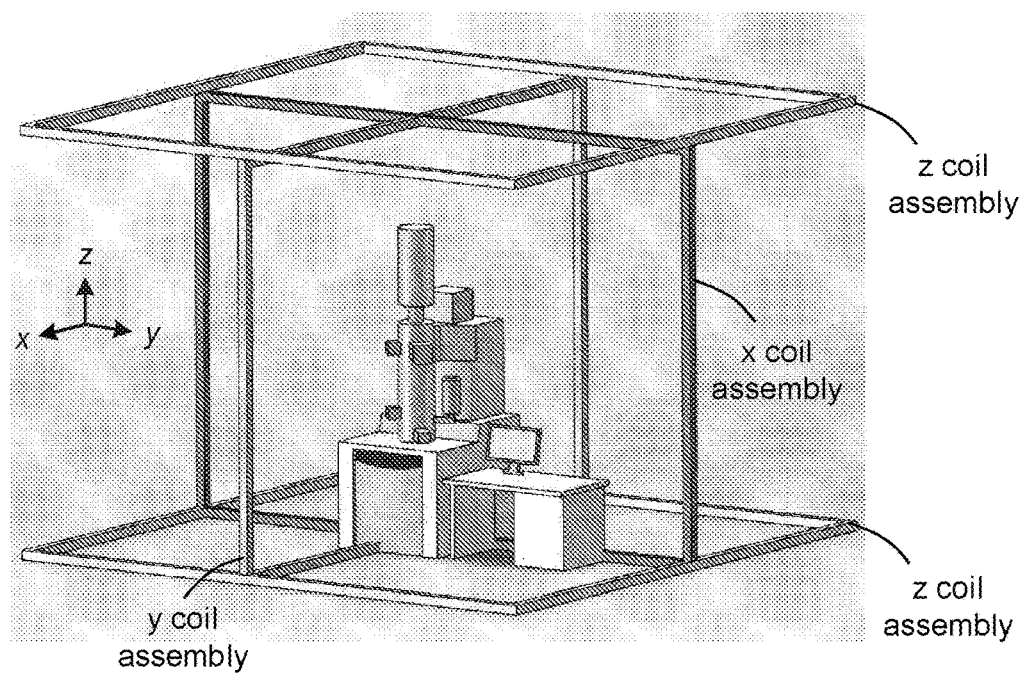
FIG. 2C depicts apparatus that may be used to suppress magnetic fields in a localized region, according to some embodiments.
Figure 2D:
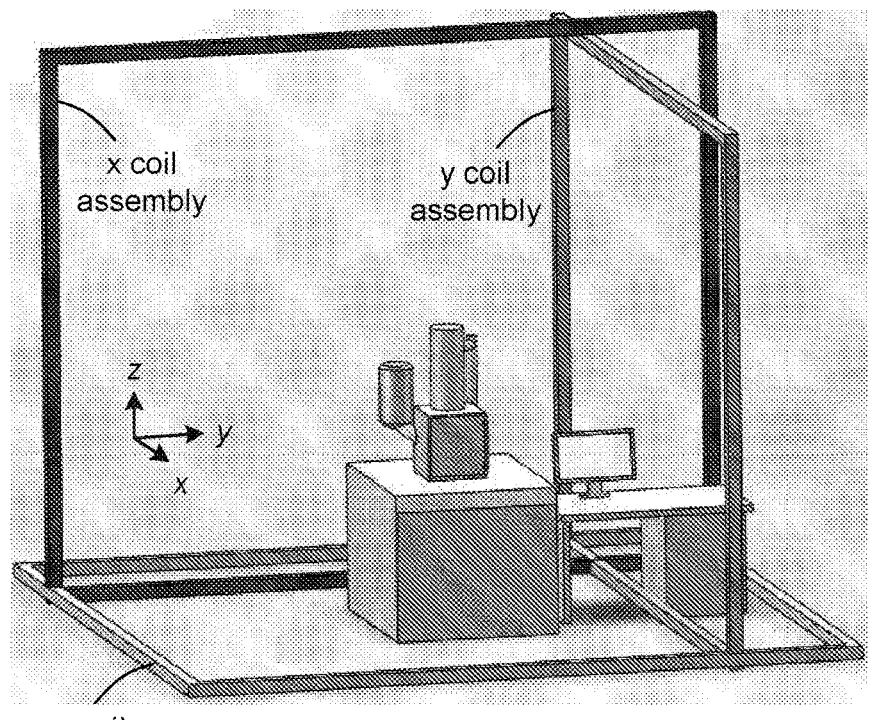
FIG. 2D depicts apparatus that may be used to suppress magnetic fields in a localized region, according to some embodiments.

FIG. 2A and FIG. 2B are simplified depictions of example magnetic field suppression systems 200, 202 that can be used to suppress unwanted magnetic fields in a localized region 205, 206. Such a localized region may be co-located with a payload (e.g., a precision instrument) that is supported by a vibration-isolation platform as described above, so as to reduce the effects of stray magnetic fields on the precision instrument. For example, a localized region 205, 206 may be located at an inspection area of an electron microscope or electron-beam lithography tool. According to some embodiments, a magnetic field suppression system includes coil assemblies 210a, 210b, 220a, 220b, 230a, 230b, 210, 220, 230, a magnetic field sensor 240, and a magnetic field controller 250. The magnetic field sensor and controller are not shown in FIG. 2B to simplify the drawing, but can be used for the magnetic field suppression system 202.

In overview, a magnetic field sensor 240 can detect magnetic field present in a localized region 205 where field suppression may be desired. The magnetic field sensor 240 may comprise one or more flux magnetometers, for example, and be arranged to sense an amount of magnetic field in one or more orthogonal directions (e.g., x, y, and/or z directions). In some implementations, a magnetic field sensor 240 may comprise one or more Hall effect sensors, fluxgate magnetic sensors, or any other sensor configured to measure static and/or time-varying directional components of magnetic field. Output from the magnetic field sensor 240 can be provided to a magnetic field controller 250 that is configured to drive electrical current in the coil assemblies to oppose the magnetic field detected by the magnetic field sensor 240. By using feedback from the magnetic field sensor and driving current to oppose the detected magnetic field by an equal and opposite amount, magnetic field lines can be substantially reduced and redistributed out of the localized region 205 to significantly reduce the amount of magnetic field within the localized region by a factor of 5 or more in amplitude over a range of frequencies and for large areas. In some cases, the suppression of magnetic field amplitude within the localized region is between a factor of 2 and 500 within a bandwidth from DC to 1000 Hz. In some cases, the suppression of magnetic field amplitude within the localized region may be between a factor of 2 and 500 within a bandwidth from DC to 5000 Hz. In some cases, the suppression of magnetic field amplitude within the localized region is at least a factor of 5 within a bandwidth from DC to 1000 Hz.

In further detail, the coil assemblies may be mounted with a vibration-isolation system for some applications to suppress magnetic field at a payload 162 that is supported by the vibration-isolation system, for example. In some implementations, the coil assemblies can be mounted on a vibration-isolation platform, such as the payload support 130 described above. In some cases, the coil assemblies can be mounted on a base 105 that supports a vibration-isolation system. In some implementations, the coil assemblies can be mounted in a larger space that encloses, at least in part, a precision instrument that includes or is mounted on a vibration-isolation system. In some embodiments, the coil assemblies can be mounted in a space that does not include a vibration-isolation platform and for which magnetic field suppression is desired. In some cases, the coil assemblies can be mounted at the periphery of a lab room or space.

A coil assembly may have any shape (e.g., rectangular as shown, square, circular, elliptical, polygonal, triangular, etc.) A minimum diameter or span $S_1$ of a coil assembly may have a value in a range between 0.25 meter and 10 meters. A maximum diameter or span $S_2$ of a coil assembly may have a value in a range between 0.25 meter and 10 meters. Electrical windings of a coil assembly can be enclosed in a casing. In some implementations, a casing may be configured to attach to one or more casings of coil assemblies to form a cage surrounding the localized region 205. For example, the coil assemblies in FIG. 2A may attach together to form a cage that can surround a payload 162 supported within the localized region 205. Alternatively or additionally, a casing of a coil assembly may be configured to attach to a surface or support, and one or more coil assemblies may be mounted apart from each other.

FIG. 2A illustrates an embodiment in which coil assemblies are provided in pairs. For example, a first pair of coil assemblies 210*a*, 210*b* may be arranged to suppress magnetic field components along a first direction (±y direction in the illustration). The first coil assembly 210*a* of a pair can be oriented approximately, essentially, or exactly parallel to the second coil assembly 210*b* in the pair. Windings in each coil assembly 210*a*, 210*b* can produce magnetic field oriented essentially along a same direction through the center of each coil assembly (e.g., along the ±y direction). A second pair of coil assemblies 220*a*, 220*b* may be arranged to suppress magnetic field components along a second direction (±x direction in the illustration), and a third pair of coil assemblies 230*a*, 230*b* may be arranged to suppress magnetic field components along a third direction (±z direction in the illustration). Such pairs may be arranged as Helmholtz coil pairs to provide more uniform magnetic field between the paired coil assemblies. By using coil assembly pairs, magnetic field may be suppressed more uniformly over a larger localized region 205.

FIG. 2B illustrates an embodiment in which a single coil assembly is used for each orthogonal direction. For example, a first coil assembly 210 may be arranged to suppress magnetic field components along the ±y direction as illustrated, and the other two coil assemblies can be arranged to suppress magnetic field components along the ±x and ±z directions. Single coil assemblies may be used for smaller localized regions 206 or where larger non-uniformity of magnetic field suppression can be tolerated.

A magnetic field suppression system can include coil assembly arrangements other than those shown in FIG. 2A and FIG. 2B. In some cases, a single coil assembly may be used for one axis in combination with a coil assembly pair, triplet, or multiplet that is used for a different axis, as depicted in the example arrangement of FIG. 2C. In the illustration, a single coil assembly for each of the x and y axes is arranged to suppress magnetic field components along the x and y axes, respectively, whereas a coil assembly pair is arranged to suppress magnetic field components along the z axis. The coil assemblies, in some cases, may not be arranged symmetrically about a central point, as depicted in the example arrangement of FIG. 2D.

In general and for regions of space that do not contain conducting or ferromagnetic objects filling part of the localized region or space between the coils, the absolute size of the localized region 205, 206 within which magnetic field is uniformly suppressed below a desired amount will depend upon the size and configuration of the coil assemblies and the value of the desired amount of magnetic field suppression. Conducting or ferromagnetic objects located in a localized region 205 can distort the magnetic field and make it less uniform. For Helmholtz coil pairs (excluding conductive or ferromagnetic objects within the coil pairs) arranged in a configuration like that shown in FIG. 2A that are square and of a same size and connected together to form a cube (excluding conductive or ferromagnetic objects within the coil pairs), an opposing magnetic field that is uniform to within 10% may be produced in a localized region 205 that is approximately $\frac{1}{27}^{th}$ the volume of the space enclosed by the coil assemblies, according to some embodiments. For example, each orthogonal dimension of the localized region 205 may be approximately $\frac{1}{3}^{rd}$ of a distance between each coil assembly in an assembly pair. In some cases where there may be three or more coil assemblies used for each axis, each orthogonal dimension of the localized region 205 may be a value between $\frac{1}{4}^{th}$ and $\frac{1}{2}$ of a distance between farthest separated coil assemblies in an assembly pair, triplet, or multiplet.

For coil assemblies arranged as shown in FIG. 2B that are square and of a same size and arranged on three orthogonal planes and share a common central point (excluding conductive or ferromagnetic objects within the coil pairs), an opposing magnetic field that is uniform to within 10% may be produced in a localized region 206 that is approximately $1/64^{th}$ the volume of the space enclosed by the coil assemblies, according to some embodiments. For example, each orthogonal dimension of the localized region 206 may be approximately $1/8^{th}$ of a span S of each coil assembly. In some cases each orthogonal dimension of the localized region 206 may be a value between $1/8^{th}$ and $1/4^{th}$ of a span S of each coil assembly.

The inventor has recognized and appreciated that applications that require suppression of static and dynamic magnetic fields over large localized regions (e.g., regions for which coil spans $S_1$, $S_2$ may be one meter or larger) can require driving large currents (e.g., more than 2-3 amps) through the coil assemblies. For example, the amount of current needed to oppose a static magnetic field B approximately doubles if the radius of a current loop in a coil assembly doubles. For a coil having a 2 meter diameter and a 10-turn winding and resistance of approximately 5 ohms, nearly 8 amps of current would be required to approximately cancel the Earth's magnetic field (typically 50 microTesla or 0.5 Gauss). The amount of power required, that would be dissipated by such a coil, would be at least 320 Watts. Although additional windings can be added to a coil to increase the magnetic field, the inductance of the coil is proportional to the square of the number of turns in the windings. Higher inductances reduce the bandwidth over which time-varying magnetic fields can be cancelled. Although driving large currents for static (DC) magnetic fields can be readily implemented, driving such large currents to suppress time-varying magnetic fields can be challenging for frequencies over approximately 100 Hz due to the large inductances of the coils. In some cases, phase variation in the feedback loop for suppressing magnetic fields can cause amplification of time-varying magnetic fields over a frequency range, which is undesirable.

Figure 3:
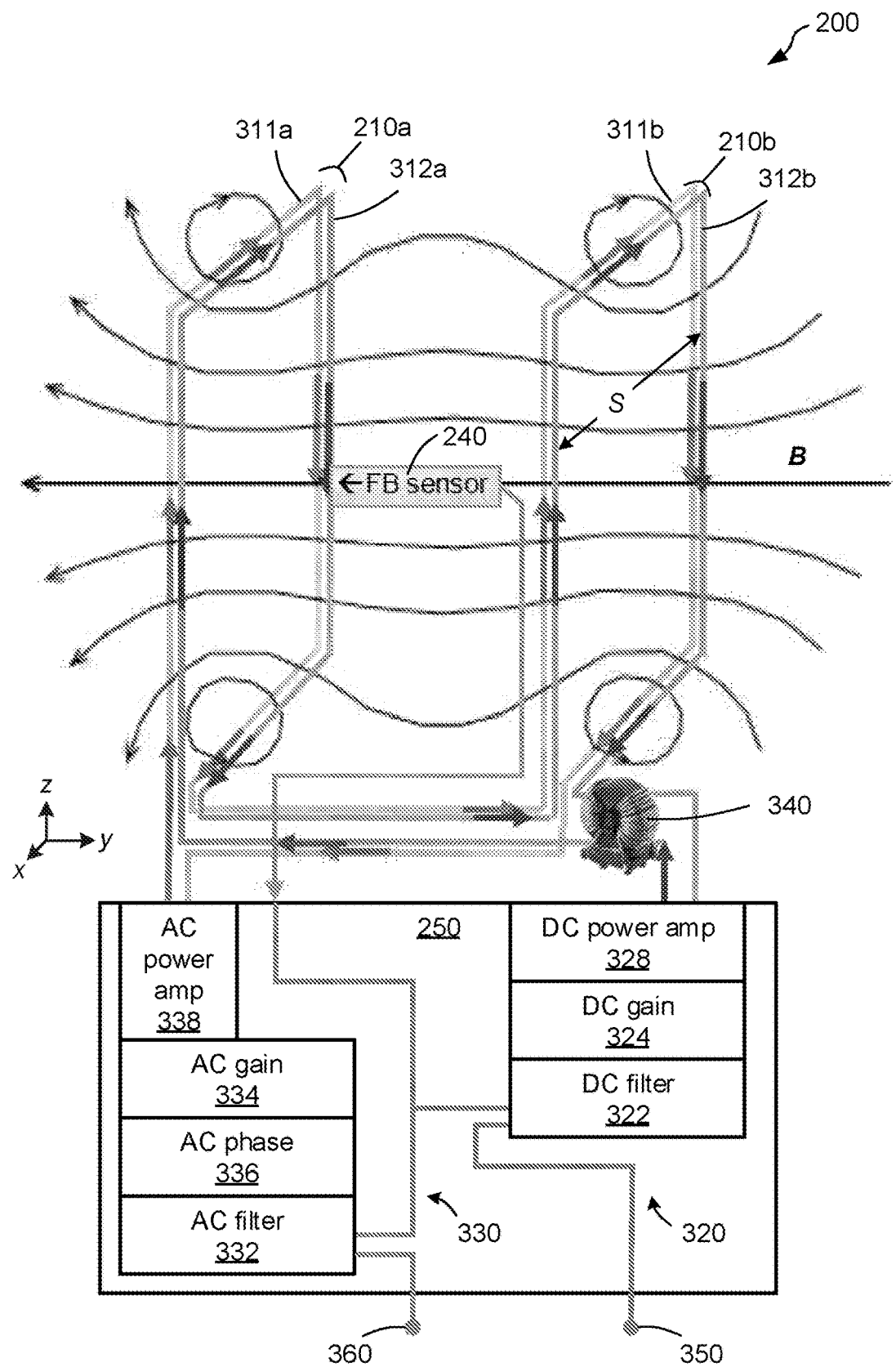
FIG. 3 depicts further details of apparatus that may be used to suppress magnetic field components in a localized region along one direction, according to some embodiments.

To avoid driving large time-varying currents in a coil assembly, each coil assembly (e.g., assembly 210a) can include a pair of coils having separate conductive windings through which electrical currents can flow to generate static and time-varying magnetic fields. An example embodiment for a pair of coil assemblies 210a, 210b is illustrated in FIG. 3. In this example, a first coil assembly 210a includes a first AC coil with a first winding 311a and a first DC coil with a second winding 312a in close proximity to each other (e.g., within 1 to 8 cm). A second coil assembly 210b of the pair of coil assemblies includes a second AC coil with a third winding 311b and a second DC coil with a fourth winding 312b in close proximity to each other (e.g., within 1 to 8 cm). The first winding 311a may connect to the third winding 311b. The second winding 312a may connect to the fourth winding 312b. Because of the close proximity of the windings, AC coils may be spaced within 1 to 8 cm from the DC coils. Although single turns are shown for each winding, there can be two or more turns for each winding of an AC coil and/or DC coil. In some cases, the number of turns in a coil may have a value in range from 1 to 50. The number of turns in an AC coil may be the same or different from a number of turns in a DC coil. The smallest span S of a coil may have a value in a range from 0.25 m to 10 m.

In some installation sites, an ambient static magnetic field may have a magnitude that is significantly larger than any ambient time-varying magnetic fields. An example ambient static magnetic field may arise from the Earth's magnetic field. Ambient time-varying magnetic fields may arise from electrical motors at an installation site, for example, and may have smaller magnitudes than ambient static fields. By providing a DC coil and separate AC coil in a coil assembly, large DC currents can be used to suppress ambient static magnetic fields and smaller time-varying currents can be used to suppress ambient time-varying magnetic fields. Accordingly, suppression of time-varying magnetic fields can be achieved at higher frequencies, since smaller currents are required for the time-varying components of magnetic fields along each axis of a system. For example, the number of turns for an AC coil can be reduced (e.g., fewer than 10 turns in some cases), which decreases inductance of the AC coil and increases bandwidth of the AC feedback loop. In some embodiments, the number of turns in an AC coil of a coil assembly 210a, 210b are less than the number of turns in the DC coil of the coil assembly 210a, 210b.

In some implementations, the size of a DC coil may differ significantly from the size of an AC coil for a coil assembly. In such cases, the AC and DC coils of a coil assembly may be enclosed in separate casings and mounted apart from each other. For example, a smaller DC coil may be mounted inside a larger AC coil, or vice versa.

The inventor has further recognized and appreciated that when a DC coil and AC coil are located in close proximity in a coil assembly 210a, 210b, they essentially form a transformer. Accordingly, the DC coil can act as a short for the AC coil and undesirably load the AC coil. To mitigate the loading, a choke 340 can be connected to a winding of the DC coil (e.g., to the second winding 312a or fourth winding 312b). A choke 340 may be implemented as a large inductor in some embodiments that significantly increases the impedance of the DC coil. According to some implementations, the inductance of the choke 340 is between 2 times and 5 times the inductance of the DC coil. In some implementations, a choke 340 may be implemented as multiple windings around a ferromagnetic core.

Figure 4:
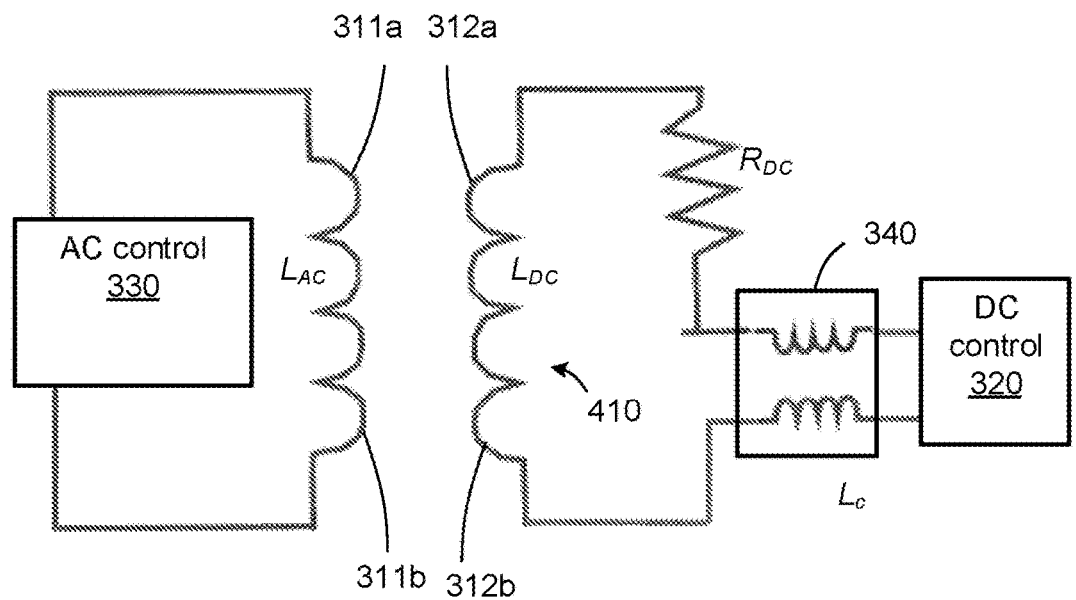
FIG. 4 illustrates a circuit model for a magnetic field suppression system, according to some embodiments.

In some cases, a choke 340 may be implemented as a common mode choke connected between "send" and "return" current lines to a DC coil, as depicted in FIG. 3 and FIG. 4. For example, a send current line may be wound multiple times around an annular ferromagnetic core and a return current line may also be wound multiple times around the same core. According to some embodiments, the windings are oriented such that send and return currents drive magnetic flux in the core in the same direction. Using a common mode choke can reduce the overall size of the choke 340.

In some implementations, a magnetic field controller 250 may be included with a vibration-isolation controller 160 in a same instrument and utilize a same interface 180. In some embodiments, a magnetic field controller 250 may comprise a stand-alone instrument and/or code deployable on a processor that can operate independently of a vibration-isolation controller. In some cases, a magnetic field controller 250 and/or vibration-isolation controller 160 can be implemented, at least in part, on a personal computer or laptop computer. A controller 250 for a coil assembly having DC and AC coils can include DC and AC current-driving circuitry, as depicted in FIG. 3. For example, a first portion of the circuitry (DC filter 322, DC gain 324, DC power amplifier 328) can be configured to receive a signal from magnetic field sensor 240 and process the received signal to determine an amount of current to drive in the DC coil. A second portion of the circuitry (AC filter 332, AC phase control 336, AC gain 334, AC power amplifier 338) can be configured to receive a signal from the sensor 240 and process the received feedback signal to determine a waveform and an amount of current to apply to the AC coil. In some implementations, a controller 250 may further be configured to receive feedforward signals at one or more feedforward inputs 350, 360 and process the received feedforward signal to determine a waveform and an amount of current to apply to the AC and/or DC coil. A feedforward signal may be obtained from an instrument at an installation site known to produce a static and/or time-varying magnetic field. One example of an instrument that may produce a time-varying magnetic field is an induction motor of air-handling equipment or of an elevator. Rapidly-varying magnetic fields (e.g., variations at frequencies over 1 Hz) may be handled by the AC current-driving circuitry. An example of an instrument that may produce a slowly-varying (1 Hz or less) magnetic field and static magnetic field is a superconducting magnet that may ramp to and from a steady state value slowly. Such slow variations may be handled by the DC current-driving circuitry in some cases. In some embodiments, the feedback and feedforward signals may be processed separately (e.g., in separate channels of feedback circuitry) and waveforms and current outputs combined before amplifying and applying to the AC coil. Although FIG. 3 depicts control for a single component of magnetic field (y axis), a controller 250 can include additional circuitry for each axis for which magnetic field suppression is desired.

For each axis of magnetic field control, a controller 250 can include DC current-driving circuitry 320 and AC current-driving circuitry 330. The DC current-driving circuitry 320 can be configured to provide an essentially steady amount of DC current to one or more DC coils 312a, 312b. The AC current-driving circuitry 330 can be configured to provide time-varying current of any suitable waveform to one or more AC coils 311a, 311b. In some embodiments, a maximum amount of current provided by the DC current-driving circuitry 320 is greater than a maximum amount of current provided by the AC current-driving circuitry 330.

According to some implementations, DC current-driving circuitry 320 can be configured as part of a feedback loop and can include a DC filter 322, a DC gain control 324, and a DC power amplifier 328. However, DC current-driving circuitry 320 may include more or fewer components than shown. For example, DC current-driving circuitry 320 may or may not include DC phase control when slowly-varying magnetic fields are suppressed by the DC feedback loop. A slowly-varying magnetic field may vary at rates up to about 1 Hz. In some cases, a DC filter 322 may not be used. One or more of the components in the DC current-driving circuitry 320 may be configured with tuning controls, so that a user can fine tune settings of the component(s) at an installation site. The DC current-driving circuitry 320 can be configured to drive current through one or more DC coils 312a, 312b in a manner to reduce the amount of DC or slowly varying magnetic field component sensed by magnetic field sensor 240, preferably to a value as near zero as possible.

A DC filter 322 may be implemented in hardware, software, or a combination of hardware and software components. As one example of a hardware implementation, a DC filter 322 may comprise an inductive choke that attenuates AC frequencies above 5 Hz, for example, by at least 10 dB. As one example of a software implementation, a DC filter 322 may comprise computer code that averages a digital waveform over long periods of time (e.g., at least one second) to extract an average value of the signal. In some cases, slow variations (e.g., cyclical variations having a period on time scales of one second or longer) may pass through the DC filter 322 and be handled by the DC current-driving circuitry 320. In operation, a DC filter 322 may receive a signal from a feedback magnetic field sensor 240 that senses a component of the magnetic field (e.g., along a ±y axis), and filter the signal to output a DC signal or slowly varying signal.

DC gain control 324 may also be implemented in hardware, software, or a combination of hardware and software components. DC gain control 324 may comprise a multiplier and gain factor that is multiplied by the signal received from the DC filter 322. An example of hardware gain control includes, but is not limited to, a variable resistor in an operational amplifier, or in a transistor configured as an amplifier. An example of software gain control includes, but is not limited to, a multiplication factor that is multiplied by a digital signal received from the DC filter.

In some embodiments, a DC power amplifier 328 can be implemented, at least in part, as one or more hardware power amplifiers capable, in total, of supplying up to 10 amps or more of current. For example, two or more power amplifiers may be connected in series, where at least the last amplifier supplies up to 10 amps or more of driving current for the one or more DC coils 312a, 312b. A power amplifier can comprise a power field-effect transistor (FET) or array of power FETs connected to amplify in parallel, for example. Output from the DC power amplifier 328 can be provided to a DC coil 312a through a choke 340, according to some embodiments.

According to some implementations, AC current-driving circuitry 330 can be configured as part of a feedback loop and can include an AC filter 332, AC phase control 326, AC gain control 334, and an AC power amplifier 338. However, AC current-driving circuitry 330 may include more or fewer components than shown. For example, AC current-driving circuitry 330 may include a signal combiner located before the AC power amplifier at which a feedforward-derived signal is combined with a feedback-derived signal. In some implementations, an AC phase control 336 may not be used. One or more of the components in the AC current-driving circuitry 330 may be configured with tuning controls, so that a user can fine tune settings of the component(s) at an installation site. The AC current-driving circuitry 330 can be configured to drive current through one or more AC coils 311a, 311b in a manner to reduce the amount of time-varying magnetic field component sensed by magnetic field sensor 240, preferably to a value as near zero as possible. In some implementations, the AC current-driving circuitry 330 may further reduce a fraction of the static magnetic field component sensed by the magnetic field sensor 240.

An AC filter 332 may be implemented in hardware, software, or a combination of hardware and software components. As one example of a hardware implementation, an AC filter 322 may comprise a capacitor connected in series in a signal line from the magnetic sensor 240. The capacitor may pass AC frequencies between 0.1 Hz and 1 kHz, for example, with less than 10 dB attenuation. As one example of a software implementation, an AC filter 332 may comprise computer code that averages a digital waveform over short periods of time (e.g., no longer than 2 milliseconds), which may filter out high frequency noise. In operation, an AC filter 332 may receive a signal from a feedback sensor 240, filter the signal, and output a filtered AC signal to AC phase control, for example.

AC phase control 336 may be implemented in hardware, software, or a combination of hardware and software components. AC phase control 336 may comprise apparatus to adjust the phase of one or more frequency components of an AC signal received from the AC filter 332. In embodiments, the phase is adjusted so that a compensating magnetic field generated by the AC coils 311a, 311b is out of phase with the sensed magnetic field (and/or anticipated magnetic field for a feedforward control) by approximately, essentially, or exactly 180 degrees, or as close to 180 degrees as possible. An example of hardware phase control includes, but is not limited to, an analog filter or one or more delay lines. An example of software gain control includes, but is not limited to, a digital filter or delay that shifts the timing of digital signal samples.

AC gain control 334 may also be implemented in hardware, software, or a combination of hardware and software components. AC gain control 334 may comprise a multiplier and gain factor that is multiplied by the signal received from the AC filter 322 and/or AC phase control 336. An example of hardware gain control includes, but is not limited to, a variable resistor in an operational amplifier, or in a transistor that is configured as an amplifier. An example of software gain control includes, but is not limited to, a multiplication factor that is multiplied by a received digital signal.

In some embodiments, an AC power amplifier 338 can be implemented, at least in part, as one or more hardware power amplifiers capable, in total, of supplying up to 4 amps of current. For example, two or more power amplifiers may be connected in series, where at least the last amplifier supplies up to 4 amps of driving current for the one or more AC coils 311a, 311b. A power amplifier can comprise a power field-effect transistor (FET) or array of FETs amplifying in parallel, for example. In some cases, a power amplifier can be configured as a linear type power amplifier or pulse width modulation type power amplifier, though other types of power amplifiers may be used in some implementations.

FIG. 4 depicts a circuit model that may be used to represent the magnetic field suppression system shown in FIG. 3. Because the AC coil(s) and DC coil(s) can be in close proximity in a magnetic field suppression system of the present embodiments, the circuit model comprises a transformer 410, in this case formed by the AC coils 311a, 311b having an inductance $L_{AC}$ and DC coils 312a, 312b having an inductance $L_{DC}$. For this model, the choke 340 is represented as a common-mode choke having inductance $L_c$. Although each coil may include some resistance, a finite resistance $R_{DC}$ is shown for the DC coils. The circuit model of FIG. 4 can be used to model the frequency response of a magnetic field suppression system of the present embodiments.

The values of inductances and resistances will depend upon the size of the magnetic field suppression system, with larger systems having higher inductances and resistances. In some embodiments, the resistance for a coil will be between 1 ohm and 20 ohms. The AC coil inductance $L_{AC}$ may be between 0.1 milliHenry (mH) and 20 mH, according to some embodiments. The DC coil inductance $L_{DC}$ may be between 0.5 mH and 50 mH, according to some embodiments. The effective inductance of a choke 340 may be between 1 mH and 250 mH, or at least 2 to 5 times more than $L_{DC}$. An advantage of using a common-mode choke is that its effective inductance can be more than twice of the nominal inductance measured on one winding of common-mode choke. The increased effective inductance increases the total impedance of the DC coil and choke at higher frequencies and allows for a smaller overall choke size.

Figure 5:
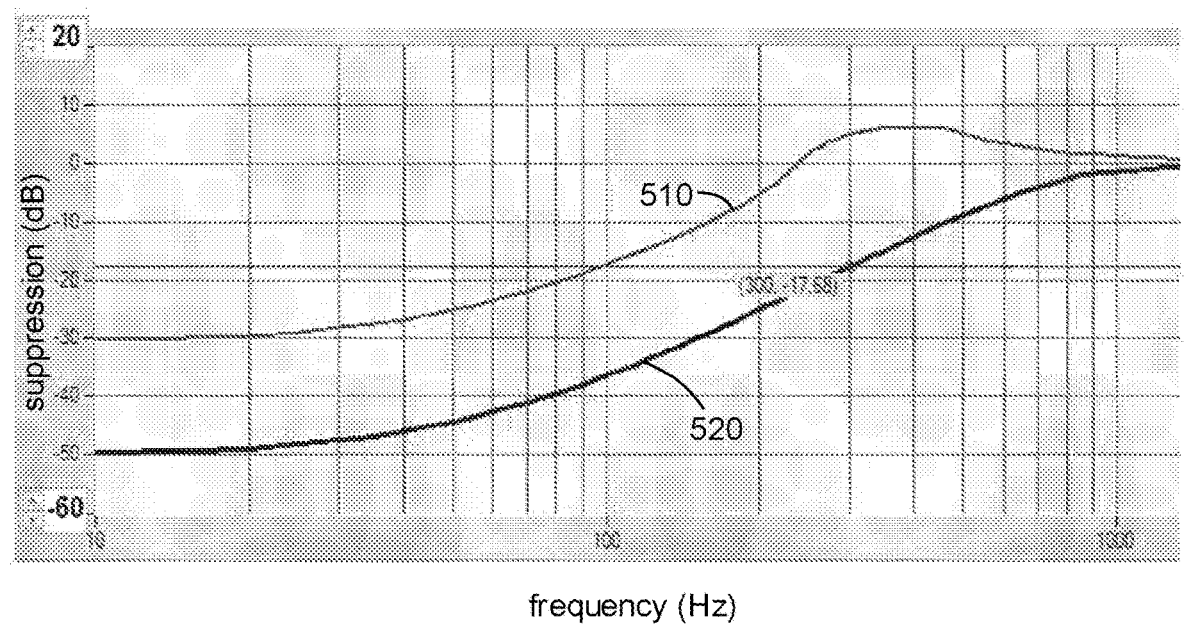
FIG. 5 plots results of suppression of magnetic fields for two example systems.

Example results of magnetic field suppression are plotted in FIG. 5. These results were obtained from two magnetic field suppression systems to which a time-varying magnetic field was applied. The two systems were arranged as depicted in FIG. 2A and were the same, except the first system did not employ chokes 340 on the DC coils whereas the second system employed common-mode chokes 340 on the DC coils. The applied time-varying magnetic field had a sinusoidal waveform and its frequency was swept from 1000 Hz to 10 Hz. The magnitude of the time-varying magnetic field was approximately 1 microTesla over this range of frequencies. Both systems were subject to the Earth's magnetic field, which was approximately 50 microTesla at the instrument's location. In both systems, the DC coils suppressed the Earth's magnetic field by at least 50 dB.

The first magnetic field suppression system did not employ chokes 340 in the DC coils. Measured suppression for this system is plotted in a first curve 510 in FIG. 5. This system shows suppression of magnetic fields up to about 100 Hz. The suppression rises from about 30 dB (a factor of essentially 32) at 10 Hz to about 15 dB at 100 Hz. However, the system shows amplification of magnetic fields above about 220 Hz. The amplification is due to the adverse effects of the DC coils on the AC coils and AC control circuitry. For example, the DC coils cause a phase change in the feedback loop above 220 Hz, such that the magnetic field generated by the AC coils adds to the magnetic field sensed by the sensor 240 rather than suppressing the ambient magnetic field. To prevent feedback oscillation, the gain of the AC current-driving circuitry may be lowered compared to a system that employs chokes in the DC coils. Accordingly, this system may not be used in environments where magnetic field suppression is required for frequencies above 220 Hz.

The second magnetic field suppression system employed common-mode chokes 340 in the DC coils. Measured suppression for the second system is plotted in a second curve 520 in FIG. 5. This system shows reasonable suppression of magnetic fields up to about 500 Hz. The suppression rises from about 44 dB (a factor of essentially 159) at 10 Hz to about 10 dB (approximately 3) at 500 Hz. At 300 Hz, the suppression is approximately 17.7 dB (approximately 8).

Magnetic field suppression systems described herein can be embodied in various configurations. Example configurations include combinations of configurations (1) through (14) as described below. Features in configurations (2) through (11) may be included in configurations (12) through (14).

(1) A magnetic field suppression system comprising: a first coil assembly having a first winding configured to generate a static magnetic field along a first direction through a center of the first coil assembly; and a second winding configured to generate a time-varying magnetic field along essentially the same direction.

(2) The magnetic field suppression system of configuration (1), further comprising a choke connected to the first winding.

(3) The magnetic field suppression system of configuration (2), wherein the choke is connected as a common mode choke.

(4) The magnetic field suppression system of any one of configurations (1) through (3), wherein the first winding is located within 8 cm from the second winding.

(5) The magnetic field suppression system of any one of configurations (1) through (4), wherein a maximum amount of current provided to the first winding by the magnetic field suppression system is greater than a maximum amount of current provided to the second winding.

(6) The magnetic field suppression system of any one of configurations (1) through (5), wherein a minimum span of the first coil assembly is between 0.25 m and 10 m.

(7) The magnetic field suppression system of any one of configurations (1) through (6), further comprising: DC control circuitry connected to the first winding and configured to provide a DC or slowly varying current having cyclic variations of 1 Hz or less to the first winding; and AC control circuitry connected to the second winding and configured to provide at least a time-varying current having cyclic variations greater than 1 Hz to the second winding.

(8) The magnetic field suppression system of configuration (7), further comprising a magnetic field sensor arranged to sense magnetic field in a region in which the time-varying magnetic field is produced and to provide a signal indicative of the magnetic field to the AC control circuitry.

(9) The magnetic field suppression system of any one of configurations (1) through (8), further comprising: a second coil assembly oriented parallel to and spaced apart from the first coil assembly and having a third winding configured to generate a static magnetic field essentially along the same direction through a center of the second coil assembly; and a fourth winding configured to generate a time-varying magnetic field essentially along the same direction.

(10) The magnetic field suppression system of configuration (9), wherein a central region between the first coil assembly and the second coil assembly excluding conductive and ferromagnetic objects and spanning approximately one-third the distance between the first coil assembly and the second coil assembly exhibits a magnetic field produced by the first coil assembly and the second coil assembly that is spatially uniform to within 10 percent.

(11) The magnetic field suppression system of any one of configurations (1) through (10), further comprising a vibration-isolation platform, wherein the first coil assembly is configured to reduce magnetic field in a localized region and the vibration-isolation platform is configured to support a payload within the localized region.

(12) A magnetic field suppression system comprising: a first coil assembly arranged to create a magnetic field in a first direction; a second coil assembly arranged to create a magnetic field in a second direction that is essentially orthogonal to the first direction; and a third coil assembly arranged to create a magnetic field in a third direction that is essentially orthogonal to the first direction and the second direction, wherein each of the first coil assembly, second coil assembly, and third coil assembly includes a first winding configured to generate a static magnetic field and a second winding configured to generate a time-varying magnetic field.

(13) The magnetic field suppression system of configuration (12) further comprising a common-mode choke connected to at least one first winding of the first coil assembly, second coil assembly, and third coil assembly.

(14) The magnetic field suppression system of configuration (12) or (13) wherein a maximum amount of current provided to a first winding in the first coil assembly is greater than a maximum amount of current provided to a second winding in the first coil assembly.

Methods of operating magnetic field suppression systems of the foregoing configurations include different combinations of acts as described in methods (15) through (17) below.

(15) A method of suppressing magnetic field in a localized region, the method comprising: applying DC current to a first winding of a coil assembly to generate a first magnetic field that reduces a static component of a magnetic field present in the localized region; and applying a first time-varying current to a second winding of the coil assembly to generate a second magnetic field that reduces a time-varying component of the magnetic field present in the localized region, wherein the first winding is located within 8 cm of the second winding.

(16) The method of (15), further comprising attenuating a second time-varying current induced in the first winding by the first time-varying current with a choke connected to the first winding.

(17) The method of (15) or (16), further comprising supporting, with a vibration-isolation system, a payload in the localized region.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Unless stated otherwise, the terms "approximately" and "about" are used to mean within ±20% of a target dimension or value in some embodiments, within ±10% of a target dimension or value in some embodiments, within ±5% of a target dimension or value in some embodiments, and yet within ±2% of a target dimension or value in some embodiments. The terms "approximately" and "about" can include the target dimension or value. The term "essentially" is used to mean within ±3% of a target dimension or value.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting.

What is claimed is:

1. A magnetic field suppression system comprising:
   a first coil assembly having a first winding configured to generate a static magnetic field along a first direction through a center of the first coil assembly; and
   a second winding configured to generate a time-varying magnetic field along essentially the first direction;
   a second coil assembly oriented parallel to and spaced apart from the first coil assembly and having a third winding configured to generate a static magnetic field essentially along the first direction through a center of the second coil assembly; and
   a fourth winding configured to generate a time-varying magnetic field essentially along the first direction.

2. The magnetic field suppression system of claim 1, further comprising a choke connected to the first winding.

3. The magnetic field suppression system of claim 2, wherein the choke is connected as a common mode choke.

4. The magnetic field suppression system of claim 1, wherein the first winding is located within 8 cm from the second winding.

5. The magnetic field suppression system of claim 1, wherein a maximum amount of current provided to the first winding by the magnetic field suppression system is greater than a maximum amount of current provided to the second winding.

6. The magnetic field suppression system of claim 1, wherein a minimum span of the first coil assembly is between 0.25 m and 10 m.

7. The magnetic field suppression system of claim 1, further comprising:
   DC control circuitry connected to the first winding and configured to provide a DC or slowly varying current having cyclic variations of 1 Hz or less to the first winding; and
   AC control circuitry connected to the second winding and configured to provide at least a time-varying current having cyclic variations greater than 1 Hz to the second winding.

8. The magnetic field suppression system of claim 7, further comprising a magnetic field sensor arranged to sense magnetic field in a region in which the time-varying magnetic field is produced and to provide a signal indicative of the magnetic field to the AC control circuitry.

9. The magnetic field suppression system of claim 1, wherein a central region between the first coil assembly and the second coil assembly excluding conductive and ferromagnetic objects and spanning approximately one-third of a distance between the first coil assembly and the second coil assembly exhibits a magnetic field produced by the first coil assembly and the second coil assembly that is spatially uniform to within 10 percent.

10. The magnetic field suppression system of claim 1, further comprising a vibration-isolation platform, wherein the first coil assembly is configured to reduce magnetic field in a localized region and the vibration-isolation platform is configured to support a payload within the localized region.

11. A method of suppressing magnetic field in a localized region, the method comprising:
   applying DC current to a first winding of a coil assembly to generate a first magnetic field that reduces a static component of a magnetic field present in the localized region;
   applying a first time-varying current to a second winding of the coil assembly to generate a second magnetic field that reduces a time-varying component of the magnetic field present in the localized region, wherein the first winding is located within 8 cm of the second winding; and
   supporting, with a vibration-isolation system, a payload in the localized region.

12. The method of claim 11, further comprising attenuating a second time-varying current induced in the first winding by the first time-varying current with a choke connected to the first winding.

13. A system comprising:
   a first coil assembly having a first winding and a second winding, wherein:
      the first winding is configured to generate a static magnetic field along a first direction through a center of the first coil assembly, and
      the second winding is configured to generate a time-varying magnetic field along essentially the first direction; and
   a vibration-isolation platform, wherein the first coil assembly is configured to reduce a total amount of magnetic field in a localized region by suppressing ambient magnetic field in the localized region and the vibration-isolation platform is configured to support a payload within the localized region.

14. The system of claim 13, further comprising a choke connected to the first winding.

15. The system of claim 14, wherein the choke is connected as a common mode choke.

16. The system of claim 13, wherein the first winding is located within 8 cm from the second winding.

17. The system of claim 13, wherein a maximum amount of current provided to the first winding by the system is greater than a maximum amount of current provided to the second winding.

18. The system of claim 13, wherein a minimum span of the first coil assembly is between 0.25 m and 10 m.

19. The system of claim 13, further comprising:
   DC control circuitry connected to the first winding and configured to provide a DC or slowly varying current having cyclic variations of 1 Hz or less to the first winding; and
   AC control circuitry connected to the second winding and configured to provide at least a time-varying current having cyclic variations greater than 1 Hz to the second winding.

20. The system of claim 19, further comprising a magnetic field sensor arranged to sense magnetic field in a region in which the time-varying magnetic field is produced and to provide a signal indicative of the magnetic field to the AC control circuitry.

21. The system of claim 13, further comprising:
   a second coil assembly oriented parallel to and spaced apart from the first coil assembly and having a third winding configured to generate a static magnetic field essentially along the first direction through a center of the second coil assembly; and
   a fourth winding configured to generate a time-varying magnetic field essentially along the first direction, wherein a central region between the first coil assembly and the second coil assembly excluding conductive and ferromagnetic objects and spanning approximately one-third of a distance between the first coil assembly and the second coil assembly exhibits a magnetic field produced by the first coil assembly and the second coil assembly that is spatially uniform to within 10 percent.

22. A magnetic field suppression system comprising:
   a first coil assembly having a first winding configured to generate a static magnetic field along a first direction through a center of the first coil assembly; and
   a second winding configured to generate a time-varying magnetic field along essentially the first direction;
   DC control circuitry connected to the first winding and configured to provide a DC or slowly varying current having cyclic variations of 1 Hz or less to the first winding; and
   AC control circuitry connected to the second winding and configured to provide at least a time-varying current having cyclic variations greater than 1 Hz to the second winding; and
   a magnetic field sensor arranged to sense magnetic field in a region in which the time-varying magnetic field is produced and to provide a signal indicative of the magnetic field to the AC control circuitry.

23. The magnetic field suppression system of claim 22, further comprising a choke connected to the first winding.

24. The magnetic field suppression system of claim 23, wherein the choke is connected as a common mode choke.

25. The magnetic field suppression system of claim 22, wherein the first winding is located within 8 cm from the second winding.

26. The magnetic field suppression system of claim 22, wherein a maximum amount of current provided to the first winding by the magnetic field suppression system is greater than a maximum amount of current provided to the second winding.

27. The magnetic field suppression system of claim 22, wherein a minimum span of the first coil assembly is between 0.25 m and 10 m.

28. The magnetic field suppression system of claim 22, further comprising:
   a second coil assembly oriented parallel to and spaced apart from the first coil assembly and having a third winding configured to generate a static magnetic field essentially along the first direction through a center of the second coil assembly; and
   a fourth winding configured to generate a time-varying magnetic field essentially along the first direction, wherein a central region between the first coil assembly and the second coil assembly excluding conductive and ferromagnetic objects and spanning approximately one-third of a distance between the first coil assembly and the second coil assembly exhibits a magnetic field produced by the first coil assembly and the second coil assembly that is spatially uniform to within 10 percent.

\* \* \* \* \*